(12) United States Patent
Shimizu et al.

(10) Patent No.: US 8,771,456 B2
(45) Date of Patent: Jul. 8, 2014

(54) METHOD OF MANUFACTURING A SEMICONDUCTOR DEVICE AND SUBSTRATE SEPARATING APPARATUS

(71) Applicant: Kabushiki Kaisha Toshiba, Tokyo (JP)

(72) Inventors: Noriko Shimizu, Yokohama (JP); Shinya Takyu, Shiraoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/790,266

(22) Filed: Mar. 8, 2013

(65) Prior Publication Data

US 2013/0248099 A1    Sep. 26, 2013

(30) Foreign Application Priority Data

Mar. 23, 2012   (JP) .................. 2012-068287

(51) Int. Cl.

| | |
|---|---|
| *B29C 65/52* | (2006.01) |
| *B29C 65/54* | (2006.01) |
| *B29C 63/48* | (2006.01) |
| *B32B 37/12* | (2006.01) |
| *B32B 37/26* | (2006.01) |
| *B32B 38/10* | (2006.01) |
| *B32B 43/00* | (2006.01) |
| *H01L 21/67* | (2006.01) |
| *H01L 21/683* | (2006.01) |
| *B29C 65/02* | (2006.01) |
| *B29C 65/48* | (2006.01) |
| *B29C 65/00* | (2006.01) |
| *B32B 7/06* | (2006.01) |
| *B32B 38/00* | (2006.01) |
| *B32B 38/18* | (2006.01) |

(52) U.S. Cl.
CPC ....... *H01L 21/67092* (2013.01); *H01L 21/6835* (2013.01); *H01L 21/6836* (2013.01); *B29C 65/02* (2013.01); *B29C 65/48* (2013.01); *B29C 66/004* (2013.01); *B32B 7/06* (2013.01); *B32B 37/26* (2013.01); *B32B 38/0004* (2013.01); *B32B 38/10* (2013.01); *B32B 38/185* (2013.01); *B32B 43/006* (2013.01)
USPC ........... 156/247; 156/248; 156/250; 156/289; 156/703; 156/718

(58) Field of Classification Search
CPC .................... H01L 21/67092; H01L 21/6835; H01L 21/6836; B29C 65/02; B29C 65/48; B29C 66/004; B32B 7/06; B32B 37/26; B32B 38/0004; B32B 38/10; B32B 38/185; B32B 43/006
USPC ......... 156/247, 248, 250, 289, 701, 703, 718, 156/719
See application file for complete search history.

(56) References Cited

U.S. PATENT DOCUMENTS 6,762,510 B2 * 7/2004 Fock et al. .................... 257/787
6,803,293 B2 * 10/2004 Yamamoto .................... 438/459

(Continued)

FOREIGN PATENT DOCUMENTS

| EP | 1298713 A1 * | 4/2003 |
|---|---|---|
| JP | 2006-32506 | 2/2006 |

(Continued)

*Primary Examiner* — Sing P Chan
(74) *Attorney, Agent, or Firm* — Oblon, Spivak, McClelland, Maier & Neustadt, L.L.P.

(57) ABSTRACT

According to one embodiment, there is disclosed a method of manufacturing a semiconductor device forming a release layer on a region excluding a peripheral edge portion of a surface of a first substrate, bonding a second substrate to at least a region including the release layer of the surface of the first substrate via an adhesive layer, removing physically a peripheral edge portion of the second substrate in a manner that at least a surface of the adhesive layer right under the peripheral edge portion of the second substrate is exposed, the adhesive layer is caused to remain between the peripheral edge portion of the first substrate and the second substrate, and adhesion between the first and second substrates is maintained, and then dissolving the adhesive layer.

19 Claims, 6 Drawing Sheets

(56) References Cited

U.S. PATENT DOCUMENTS

| | | | |
|---|---|---|---|
| 6,930,023 B2* | 8/2005 | Okada et al. | 438/459 |
| 7,060,339 B2* | 6/2006 | Matsumura et al. | 428/66.6 |
| 7,438,631 B2* | 10/2008 | Nagamoto et al. | 451/59 |
| 7,462,552 B2* | 12/2008 | Tong et al. | 438/458 |
| 7,534,498 B2* | 5/2009 | Noda et al. | 428/446 |
| 7,566,632 B1* | 7/2009 | Rothwell et al. | 438/455 |
| 7,736,462 B2* | 6/2010 | Weichart | 156/345.51 |
| 7,759,050 B2* | 7/2010 | Kessel et al. | 430/319 |
| 7,935,574 B2* | 5/2011 | Saiki et al. | 438/113 |
| 7,988,807 B2* | 8/2011 | Noda et al. | 156/272.2 |
| 8,038,839 B2* | 10/2011 | Noda et al. | 156/712 |
| 8,072,044 B2* | 12/2011 | Gruenhagen et al. | 257/618 |
| 8,080,121 B2* | 12/2011 | Inao | 156/155 |
| 8,178,420 B2* | 5/2012 | Matsumura et al. | 438/460 |
| 8,331,025 B2* | 12/2012 | Kobayashi et al. | 359/489.07 |
| 8,450,188 B1* | 5/2013 | Lindsey, Jr. | 438/462 |
| 8,551,291 B2* | 10/2013 | George | 156/706 |
| 8,586,415 B2* | 11/2013 | Matsumura et al. | 438/114 |
| 8,652,938 B2* | 2/2014 | Takamoto et al. | 438/460 |
| 2002/0048907 A1* | 4/2002 | Miyamoto et al. | 438/464 |
| 2002/0061451 A1* | 5/2002 | Kita et al. | 430/2 |
| 2002/0061723 A1* | 5/2002 | Duescher | 451/527 |
| 2002/0151438 A1* | 10/2002 | Mihara et al. | 503/227 |
| 2003/0057525 A1* | 3/2003 | Fock et al. | 257/629 |
| 2003/0113984 A1* | 6/2003 | Okada et al. | 438/459 |
| 2003/0173017 A1* | 9/2003 | Hecht et al. | 156/154 |
| 2005/0046042 A1* | 3/2005 | Matsumura et al. | 257/782 |
| 2005/0233547 A1* | 10/2005 | Noda et al. | 438/459 |
| 2006/0032587 A1* | 2/2006 | Hecht et al. | 156/382 |
| 2006/0102987 A1* | 5/2006 | Saiki et al. | 257/632 |
| 2006/0108231 A1* | 5/2006 | Weichart | 205/165 |
| 2006/0148131 A1* | 7/2006 | Matsumura et al. | 438/113 |
| 2006/0194412 A1* | 8/2006 | Nakayama | 438/455 |
| 2006/0234581 A1* | 10/2006 | Saito et al. | 442/149 |
| 2007/0004171 A1* | 1/2007 | Arana et al. | 438/455 |
| 2007/0066184 A1* | 3/2007 | Nagamoto et al. | 451/41 |
| 2007/0074822 A1* | 4/2007 | Akechi | 156/584 |
| 2007/0184630 A1* | 8/2007 | Cullen et al. | 438/455 |
| 2008/0169062 A1* | 7/2008 | Kishimoto et al. | 156/280 |
| 2009/0115075 A1* | 5/2009 | Kessel et al. | 257/787 |
| 2009/0133812 A1* | 5/2009 | Noda et al. | 156/153 |
| 2010/0038035 A1* | 2/2010 | Noda et al. | 156/379.6 |
| 2010/0041211 A1* | 2/2010 | Noda et al. | 438/464 |
| 2010/0263794 A1* | 10/2010 | George et al. | 156/344 |
| 2010/0266373 A1* | 10/2010 | George et al. | 414/225.01 |
| 2010/0276074 A1* | 11/2010 | Nakayama | 156/238 |
| 2010/0330788 A1* | 12/2010 | Yu et al. | 438/514 |
| 2011/0010908 A1* | 1/2011 | George et al. | 29/426.2 |
| 2011/0013865 A1* | 1/2011 | Shibata et al. | 385/14 |
| 2011/0014774 A1* | 1/2011 | Johnson et al. | 438/455 |
| 2011/0061808 A1* | 3/2011 | Nakata | 156/285 |
| 2011/0136321 A1* | 6/2011 | Kuroda et al. | 438/459 |
| 2011/0253314 A1* | 10/2011 | George | 156/706 |
| 2011/0253315 A1* | 10/2011 | George | 156/718 |
| 2011/0290415 A1* | 12/2011 | George | 156/247 |
| 2011/0297771 A1* | 12/2011 | Noda et al. | 241/65 |
| 2012/0064669 A1* | 3/2012 | Higuchi | 438/114 |
| 2012/0088333 A1* | 4/2012 | Matsumura et al. | 438/114 |
| 2013/0048224 A1* | 2/2013 | George et al. | 156/752 |
| 2013/0133836 A1* | 5/2013 | Yasumoto et al. | 156/382 |
| 2013/0140838 A1* | 6/2013 | Wang et al. | 294/188 |
| 2013/0192754 A1* | 8/2013 | Dukkipati et al. | 156/308.2 |
| 2013/0207214 A1* | 8/2013 | Haddad et al. | 257/432 |
| 2013/0244400 A1* | 9/2013 | George et al. | 438/458 |
| 2013/0280886 A1* | 10/2013 | Kato et al. | 438/459 |
| 2013/0299946 A1* | 11/2013 | Takahashi et al. | 257/618 |
| 2013/0302983 A1* | 11/2013 | Tanabe et al. | 438/691 |
| 2013/0323907 A1* | 12/2013 | Oosterhuis et al. | 438/460 |
| 2014/0038392 A1* | 2/2014 | Yonehara et al. | 438/463 |
| 2014/0057450 A1* | 2/2014 | Bourbina et al. | 438/759 |

FOREIGN PATENT DOCUMENTS

| | | |
|---|---|---|
| JP | 2010-177378 | 8/2010 |
| JP | 2010-225852 | 10/2010 |
| JP | 2011-146457 | 7/2011 |
| WO | WO 2012118700 A1 * | 9/2012 |

\* cited by examiner

METHOD OF MANUFACTURING A SEMICONDUCTOR DEVICE AND SUBSTRATE SEPARATING APPARATUS

CROSS-REFERENCE TO RELATED APPLICATION

This application is based upon and claims the benefit of priority from the prior Japanese Patent Application No. 2012-068287 filed on Mar. 23, 2012; the entire contents of all of which are incorporated herein by reference.

FIELD

Embodiments described herein relate generally to a method of manufacturing a semiconductor device and a substrate separating apparatus.

BACKGROUND

As a method of thinning a semiconductor wafer, there has been known a method in which a semiconductor wafer is bonded to a thick supporting substrate with an adhesive to grind the semiconductor wafer. By bonding a semiconductor wafer to a thick supporting substrate, the flatness of the semiconductor wafer at the time of grinding can be well maintained, and the semiconductor wafer can be uniformly thinned to a thickness of about 15 to about 100 µm. The thinned semiconductor wafer has required processes such as circuit pattern formation performed on a ground surface thereof while remaining bonded to the supporting substrate, and then is separated from the supporting substrate and is subjected to dicing to be formed into chips.

According to the above-described method, it is necessary to separate the semiconductor wafer from the supporting substrate after the thinning. However, the thinned semiconductor wafer of course has a small mechanical strength and is likely to be broken. For this reason, there is required a method capable of separating the semiconductor wafer from the supporting substrate without breaking the semiconductor wafer. On the other hand, the separation work greatly affects the productivity of semiconductor chips, and when time is taken for the work, the productivity decreases. For this reason, there is required a method capable of separating the semiconductor wafer from the supporting substrate for a short period of time.

As described above, the application of the method in which two substrates are bonded together through an adhesive, and then be separated into the respective substrates again is not limited to the above-described case of the semiconductor wafer and the supporting substrate. It is applied widely in various fields, in which, similarly, there is required a method capable of separating the bonded substrates for a short period of time without breaking the substrates.

DETAILED DESCRIPTION

Figure 1A:
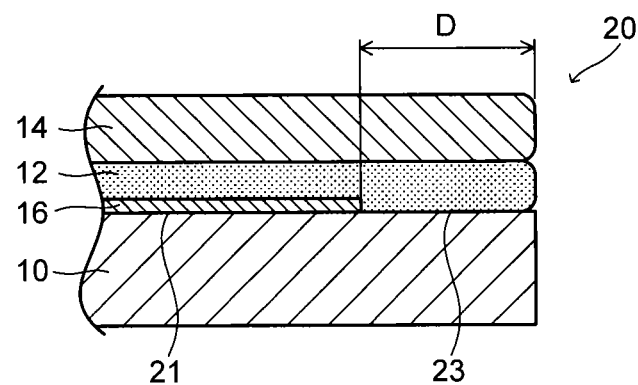
FIG. 1A to FIG. 1D each illustrate a substrate separating method according to a first embodiment.

According to one embodiment, there is disclosed a method of manufacturing a semiconductor device forming a release layer on a region excluding a peripheral edge portion of a surface of a first substrate, bonding a second substrate to at least a region including the release layer of the surface of the first substrate via an adhesive layer, removing physically a peripheral edge portion of the second substrate in a manner that at least a surface of the adhesive layer right under the peripheral edge portion of the second substrate is exposed, the adhesive layer is caused to remain between the peripheral edge portion of the first substrate and the second substrate, and adhesion between the first and second substrates is maintained, and then dissolving the adhesive layer.

According to another embodiment, there is disclosed an apparatus of separating a first substrate having a release layer formed on a region excluding a peripheral edge portion of a front surface thereof and a second substrate bonded to at least a region including the release layer of the front surface of the first substrate via an adhesive layer. The above apparatus includes: a removing device that physically removes a peripheral edge portion of the second substrate; and a supplying device that supplies a solvent to dissolve the adhesive layer to a periphery of the second substrate having had the peripheral edge portion removed therefrom by the removing device.

Various embodiments will be described hereinafter with reference to the accompanying drawings. In the illustration of the following drawings, the same reference numerals and symbols are added to the components having the same structures or the same functions and overlapped explanations are omitted. In all the embodiments to be explained below, the case where one of two substrates to be separated is a semiconductor wafer and the other is a supporting substrate supporting the semiconductor wafer is explained as an example, but it is not limited to such a case. It is applicable widely as long as two substrates to be separated are such that two substrates are bonded together through an adhesive, required processes are performed on these substrates, and then the two substrates are needed to be separated again.

First Embodiment

FIG. 1A to FIG. 1D are schematic cross-sectional views sequentially illustrating steps of a substrate separating method in a first embodiment. In each of FIG. 1A to FIG. 1D and the drawings to be illustrated hereinafter, only peripheral edge portions of two substrates to be separated (a semiconductor wafer and a supporting substrate) and their vicinities are illustrated.

The substrate separating method in the embodiment is a method of separating a supporting substrate (first substrate) 10 made of glass, silicon, or the like and a semiconductor wafer (second substrate) 14 bonded to a surface of the supporting substrate 10 via an adhesive layer 12, as illustrated in FIG. 1A.

The supporting substrate 10 have functions to reinforce or complement the mechanical strength and the like of the semiconductor wafer 14 and to maintain the flatness of the semiconductor wafer 14 when processes such as thinning and circuit pattern formation are performed on the semiconductor wafer or the semiconductor wafer is transferred for the processes. Materials of the supporting substrate 10 include, but are not limited to, silicon, alumina, silicon carbide, aluminum, stainless steel, resin. The shape of the supporting substrate 10 may be appropriately determined depending on the shape of the semiconductor wafer 14, and further the thickness of the supporting substrate 10 may be appropriately determined depending on its material, desired strength, or the like.

On a center region (also called a release layer formation region) 21 of one main surface (front surface) of the supporting substrate 10, a release layer 16 made of a non-releasable resin that does not exhibit adhesiveness to the adhesive layer 12, and the like is provided. That is, the front surface of the supporting substrate 10 is constituted by the release layer formation region 21 having the release layer 16 formed thereon at a center portion and a release layer non-formation region 23 at the peripheral edge portion.

The release layer 16 is preferably formed to have an area as large as possible in a range where the semiconductor wafer 14 bonded to the front surface of the supporting substrate 10 with the adhesive layer 12 is not separated when being subjected to the processes such as thinning and being transferred. Depending on the adhesive force of an adhesive to the semiconductor wafer 14 and the supporting substrate 10, and the like, a distance (D) from an outer edge of the release layer 16 to an outer edge of the adhesive layer 12 preferably falls within a range of 1.0 to 4.0 mm or so, more preferably falls within a range of 2.0 to 3.5 mm or so, and still more preferably falls within a range of 2.5 to 3.0 mm or so. If the distance (D) is less than 1.0 mm, there may be a risk that the semiconductor wafer 14 is separated from the supporting substrate 10 when being subjected to the processes and being transferred, and if the distance (D) exceeds 4.0 mm, the width of the peripheral edge portion of the semiconductor wafer 14 to be removed in a later-described removing step is widened and a formation region of semiconductor elements or a circuit pattern of the semiconductor wafer 14 is narrowed. Further, as a result, the number of semiconductor chips to be taken from the single semiconductor wafer 14 may be reduced.

The semiconductor wafer 14 is not limited in particular, and may be one having an orientation flat, or may also be one having a notch. Further, the shape of the peripheral edge portion is also not limited in particular, and the peripheral edge portion may be formed to have a flat surface or a curved surface, or may also be formed to have a combination of them. Materials of the semiconductor wafer 14 include semiconductor materials such as, for example, silicon, sapphire, and gallium arsenide. The semiconductor wafer 14 may also have a circuit pattern or a circuit pattern and semiconductor elements formed on the surface facing the supporting substrate 10, of which illustration/illustrations is/are omitted. These circuit patterns and semiconductor elements may be formed on an inner region from the peripheral edge portion to be removed in a later-described removing step.

For a material of the adhesive layer 12, an adhesive having, for example, acryl-based resin, hydrocarbon-based resin (polycycloolefin resin, terpene resin, petroleum resin, or the like), novolak-type phenol resin, and so on that are dissolvable in an organic solvent as its main component may be used. Such an adhesive is coated on the semiconductor wafer 14 or the supporting substrate 10, and is preferably coated on the surface of the semiconductor wafer 14, and thereby the adhesive layer 12 is formed. The coating of the adhesive may be performed by using a coating apparatus such as a spin coater while rotating the semiconductor wafer 14 (or the supporting substrate 10), for example. This makes it possible to form the adhesive layer 12 having a uniform thickness of 5 to 100 µm or so, for example. As for the adhesive, one type itself may be used, or two types or more may also be combined to be used. From the viewpoint of preventing breakage of the semiconductor wafer 14 at the time of processes and transfer, the adhesive layer 12 is preferably formed on the entire front surface of the semiconductor wafer 14.

The substrate separating method in this embodiment is performed by the following procedures with respect to a substrate made by the semiconductor wafer 14 being bonded to the front surface of the supporting substrate 10 as above via the adhesive layer 12, (which is called a bonded substrate 20, hereinafter).

Figure 1B:
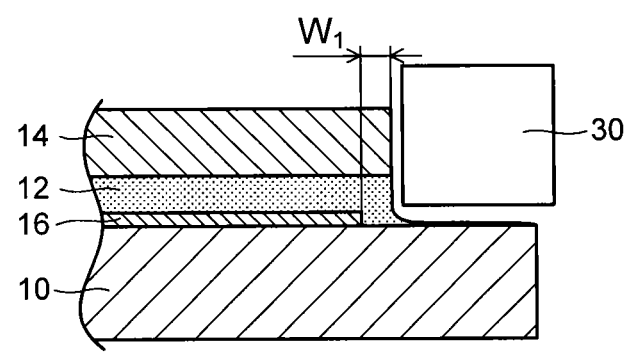

First, as illustrated in FIG. 1B, while rotating the above-described bonded substrate 20, the peripheral edge portion of the semiconductor wafer 14 is removed by using a blade 30 such as a dicing blade in a manner that a front surface of the adhesive layer 12 right under the peripheral edge portion of the semiconductor wafer 14 is exposed, the adhesive layer 12 is caused to remain between the peripheral edge portion of the supporting substrate 10 and the semiconductor wafer 14, and the adhesion between the supporting substrate 10 and the semiconductor wafer 14 is maintained. In this embodiment, the peripheral edge portion of the semiconductor wafer 14 is removed together with the adhesive right under the peripheral edge portion of the semiconductor wafer 14 in a manner to cause a portion having a width ($W_1$) of about 0.5 mm or more, for example, 0.5 mm from the outer edge of the release layer 16, outside the release layer 16 in plan view, which is the peripheral edge portion of the semiconductor wafer 14, to remain.

Figure 2:
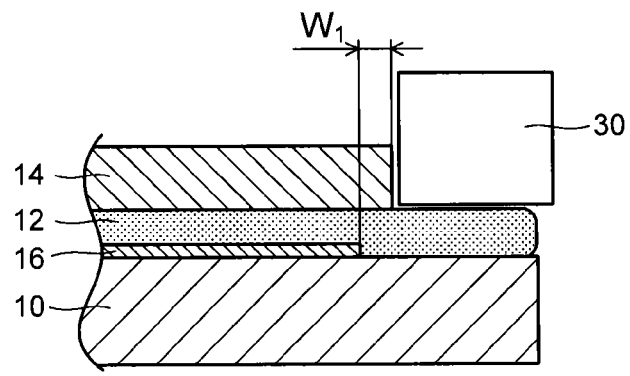
FIG. 2 illustrates a modified example in the first embodiment.
Figure 3:
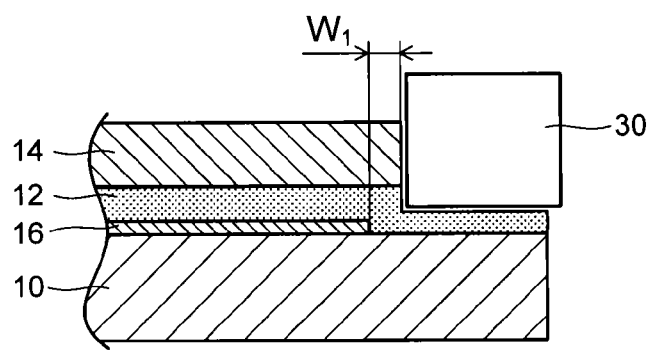
FIG. 3 illustrates a modified example in the first embodiment.

In the example illustrated in FIG. 1B, as for the adhesive, the adhesive right under the removed peripheral edge portion of the semiconductor wafer 14 is removed substantially completely by the blade 30 to substantially reach the front surface of the supporting substrate 10, but as described above, it is only necessary that at least the front surface of the adhesive layer 12 should be exposed. Thus, as illustrated in FIG. 2, for example, it is also possible to design to remove only the peripheral edge portion of the semiconductor wafer 14 without removing the adhesive, and further as illustrated in FIG. 3, it is also possible to design to remove, for example, about half of the thickness of the adhesive layer 12. From the viewpoint of reducing separation time, the adhesive right under the peripheral edge portion of the semiconductor wafer 14 is preferably removed substantially completely.

Figure 4:
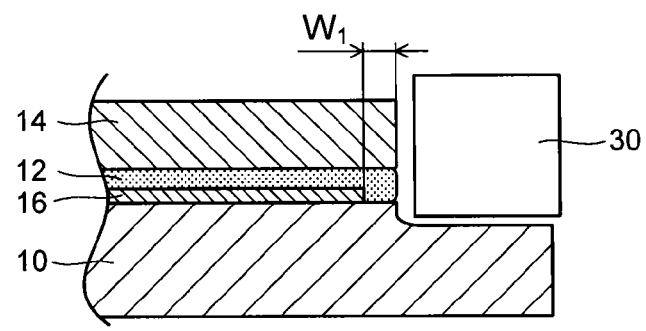
FIG. 4 illustrates a modified example in the first embodiment.

Further, as illustrated in FIG. 4, it is also possible to design to perform cutting into the supporting substrate 10 by the blade 30. The above method is difficult to the case where the supporting substrate 10 is made of glasses, and further part of the supporting substrate 10 is removed to thus make it impossible to reuse the supporting substrate 10 as is in other examples. However, in the case when the thickness of the adhesive layer 12 is thin, (which is 20 µm or less, for example), and it is difficult to remove the semiconductor wafer 14 or the semiconductor wafer 14 and the adhesive layer 12 selectively, the above method is useful. The depth of cutting by the blade 30 is preferably set to a depth that is not deep enough to break the supporting substrate 10.

Figure 1C:
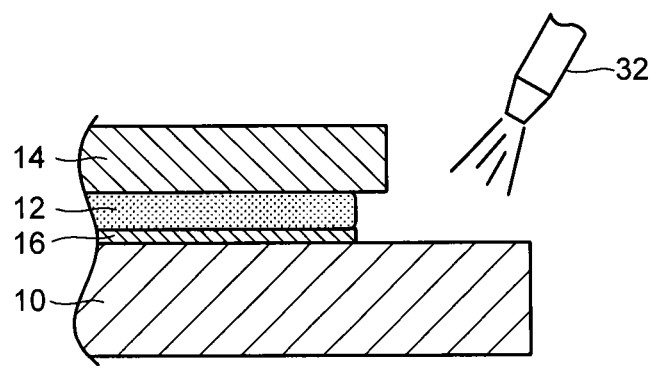

Next, as illustrated in FIG. 1C, the adhesive layer 12 bonding the supporting substrate 10 and the semiconductor wafer 14 is dissolved. The dissolution can be performed by supplying an organic solvent to dissolve the adhesive to the periphery of the adhesive layer 12, more specifically to the vicinity of an exposed surface of the adhesive layer exposed by the removal of the peripheral edge portion of the semiconductor wafer 14 by a solvent supplying device such as a nozzle 32. On this occasion, the supply of the organic solvent is preferably performed while rotating the bonded substrate 20 at a slow speed. The rotation of the bonded substrate 20 at a slow speed makes it possible to prevent residence of the dissolved adhesive and to dissolve the adhesive efficiently.

The organic solvents used for dissolving the adhesive include, but are not limited to, ketones such as p-menthane, d-limonene, p-menthane, acetone, methyl ethyl ketone, cyclohexanone, methyl isoamyl ketone, 2-heptanone, and N-methyl-2-pyrrolidone; polyhydric alcohols such as ethylene glycol, ethylene glycol monoacetate, diethylene glycol, diethylene glycol monoacetate, propylene glycol, propylene glycol monoacetate, monomethyl ether of dipropylene glycol or dipropylene glycol monoacetate, monoethyl ether, monopropyl ether, monobutyl ether, and monophenyl ether and their derivatives; cyclic ethers such as dioxane; esters such as methyl lactate, ethyl lactate, methyl acetate, ethyl acetate, butyl acetate, methyl pyruvate, ethyl pyruvate, methoxy methyl propionate, and ethoxy ethyl propionate; and hydrocarbons such as mesitylene. It is only necessary that from among them, one or more should be appropriately selected to be used according to the adhesive to be used.

Figure 1D:
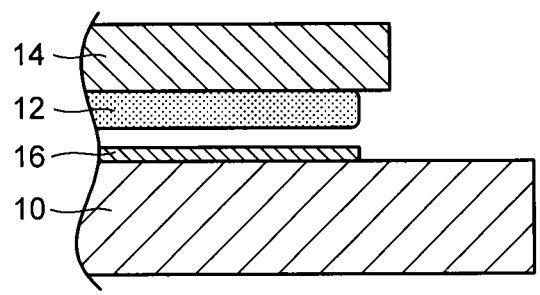

In the above dissolving step, it is not necessary to dissolve all the adhesive layer 12 interposed between the supporting substrate 10 and the semiconductor wafer 14, and it is only necessary that the adhesive caused to remain in the portion outside the release layer 16, namely the adhesive remaining on the release layer non-formation region 23 of the supporting substrate 10 should be dissolved. The adhesive layer 12 and the release layer 16 are not bonded to each other, so that by dissolving the adhesive in the portion outside the release layer 16, the bonded substrate 20 can be separated by an interface between the adhesive layer 12 and the release layer 16, as illustrated in FIG. 1D. Incidentally, as long as the separation is possible, the dissolution of the adhesive on the release layer non-formation region 23 may also be partial dissolution. Thus, the term of "dissolution" here also includes such partial dissolution.

On the semiconductor wafer 14 separated as above, the adhesive and an adhesive dissolved material are attached, and on the other hand, on the front surface of the supporting substrate 10 including the front surface of the release layer 16 as well, a few adhesive dissolved materials and possibly, the adhesive are attached, so that after the above-described dissolving step, the semiconductor wafer 14 and the supporting substrate 10 are each washed according to need to remove the attached adhesive and adhesive dissolved materials. This makes it possible to obtain the semiconductor wafer and the supporting substrate having the release layer provided thereon from which the adhesive and adhesive dissolved materials have been removed, and the semiconductor wafer is transferred to a subsequent manufacturing step of semiconductor chips. Further, the supporting substrate having the release layer provided thereon can be used again as a supporting substrate for a semiconductor wafer. For the wash of the adhesive and adhesive dissolved materials, an organic solvent similar to that used in the dissolving step can be used.

In this embodiment, the peripheral edge portion of the semiconductor wafer 14 on the release layer non-formation region 23, being the region outside the release layer 16 of the front surface of the supporting substrate 10, is physically removed by the blade 30 in a manner that at least the front surface of the adhesive layer 12 right under the peripheral edge portion of the semiconductor wafer 14 is exposed, the adhesive layer 12 is caused to remain between the peripheral edge portion of the supporting substrate 10 and the semiconductor wafer 14, and the adhesion between the supporting substrate 10 and the semiconductor wafer 14 is maintained, and then the adhesive layer 12 interposed between the supporting substrate 10 and the semiconductor wafer 14 is dissolved, so that it is possible to separate the semiconductor wafer 14 and the supporting substrate 10 from each other for a short period of time without breaking both the supporting substrate 10 and the semiconductor wafer 14.

That is, in the case when the dissolving step of the adhesive layer 12 is performed on the above-described bonded substrate 20 without removing the peripheral edge portion of the semiconductor wafer 14, it is necessary to cause the organic solvent that dissolves the adhesive to permeate through the inside of the adhesive layer 12 to reach at least the outer edge of the release layer 16 from a peripheral surface of the adhesive layer 12 having a small thickness exposed to a peripheral surface of the bonded substrate 20 to dissolve the adhesive, which extremely takes time depending on the types of the adhesive and the organic solvent. According to an experiment actually conducted by present inventors, in the case when the thickness of the adhesive layer 12 was 30 µm and the distance from the outer edge of the adhesive layer 12 to the outer edge of the release layer 16 was 3 mm, 20 to 30 hours were required to bring the adhesive layer 12 into a dissolved state where the adhesive layer 12 is separable since the start of supply of the organic solvent. Contrary to this, in this embodiment (the case where the remaining width ($W_1$), of the adhesive layer, from the outer edge of the release layer 16 was set to about 0.5 mm and the adhesive outside the release layer 16 was removed substantially completely in the removing step), the adhesive layer 12 was dissolved for 25 to 35 minutes.

Further, in the removing step of the peripheral edge portion of the semiconductor wafer 14, the blade such as a dicing blade used in general for the process of the semiconductor wafer can be used, so that there is no risk of breaking both the semiconductor wafer 14 and the supporting substrate 10.

Further, since there is no risk of breakage of the supporting substrate 10 as above, the supporting substrate 10 can be reused sufficiently except the case illustrated in FIG. 4. Further, in the removing step, the peripheral edge portion of the semiconductor wafer 14 is removed by the blade 30 and an effect similar to that obtained when edge trimming is performed can be obtained, so that edge trimming on the semiconductor wafer in a different step can be omitted. That is, it is possible to suppress wafer cracking and wafer chipping after the separation without using the semiconductor wafer that is edge trimmed previously.

Incidentally, in this embodiment, as a removing device of the peripheral edge portion of the semiconductor wafer 14, the blade 30 is used, but it is only necessary that the removing device should be one allowing the peripheral edge portion of the semiconductor wafer 14 to be removed physically without breaking the semiconductor wafer 14, and the removing device is not limited to the blade in particular.

Second Embodiment

FIG. 5A to FIG. 5D are schematic cross-sectional views sequentially illustrating steps of a substrate separating method in a second embodiment.

Figure 5A:
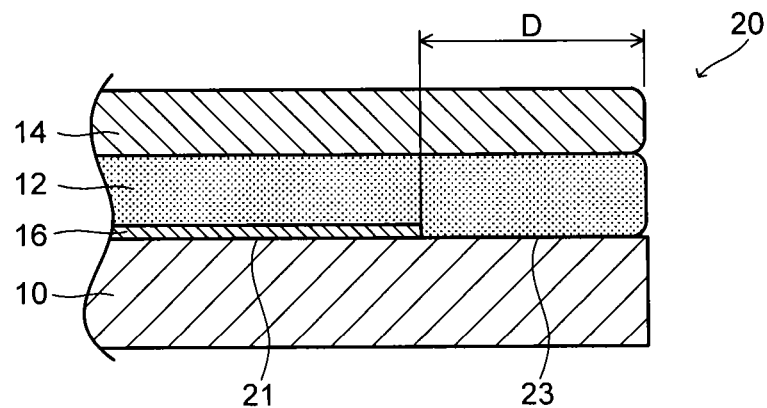
FIG. 5A to FIG. 5D each illustrate a substrate separating method according to a second embodiment.
Figure 5B:
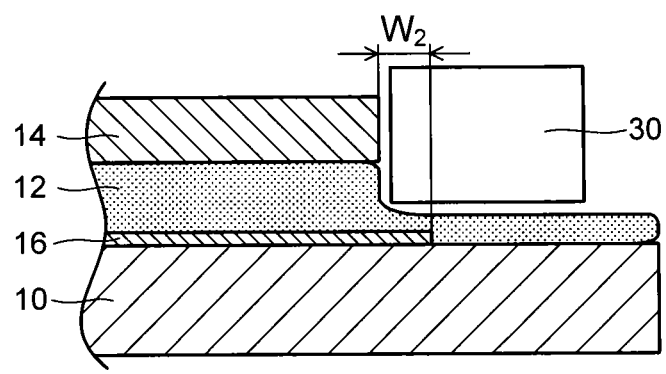

The substrate separating method in this embodiment, similarly to the first embodiment, is a method of separating the substrate 20 made by the semiconductor wafer 14 being bonded to the front surface of the supporting substrate 10 via the adhesive layer 12, as illustrated in FIG. 5A.

Further, in this embodiment, in the removing step, similarly to the first embodiment, while rotating the above-described bonded substrate 20, the peripheral edge portion of the semiconductor wafer 14 is removed by using the blade 30 such as a dicing blade in a manner that at least the front surface of the adhesive layer 12 right under the peripheral edge portion of the semiconductor wafer 14 is exposed, the adhesive layer 12 is caused to remain between the peripheral edge portion of the supporting substrate 10 and the semiconductor wafer 14, and the adhesion between the supporting substrate 10 and the semiconductor wafer 14 is maintained.

However, in the first embodiment, the portion on the outer side from the release layer 16 in plan view, which is the peripheral edge portion of the semiconductor wafer 14, is removed, while in this embodiment, a portion of the semiconductor wafer 14 corresponding to a portion from the inside of the release layer 16, which is a position about 0.5 mm or more, for example, 0.5 mm closer to the center from the outer edge of the release layer 16, to the outside of the release layer 16 is removed together with the adhesive right under the portion of the semiconductor wafer 14. Then, for securing the adhesion between the supporting substrate 10 and the semiconductor wafer 14, the adhesive is removed in a manner to cause about half of the thickness of the adhesive layer 12 to remain.

Figure 6:
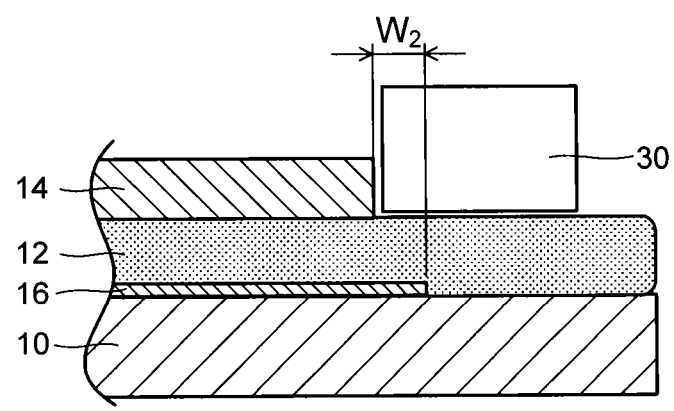
FIG. 6 illustrates a modified example in the second embodiment.

As long as it is possible to secure the adhesion between the supporting substrate 10 and the semiconductor wafer 14, the thickness of the adhesive layer 12 caused to remain may also be thinner or thicker. That is, as illustrated in FIG. 6, for example, it is also possible to design to remove only the peripheral edge portion of the semiconductor wafer 14 without removing the adhesive. However, for securing the adhesion between the supporting substrate 10 and the semiconductor wafer 14, it is necessary to cause the adhesive to remain on the supporting substrate 10, unlike the first embodiment. For that reason, the adhesive layer 12 preferably has a thickness of 20 μm or more in general, depending on the type of the adhesive.

Figure 5C:
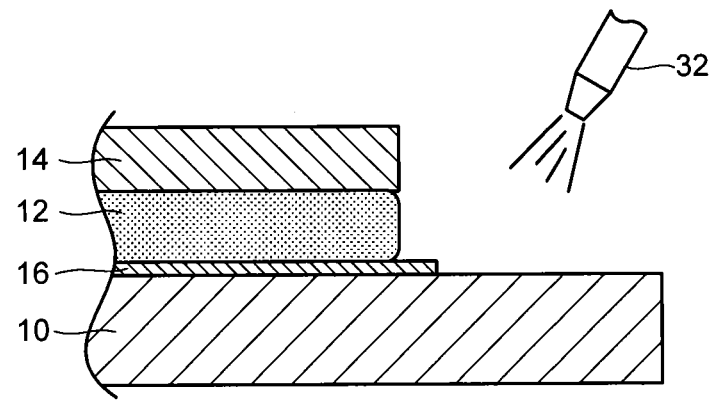
Figure 5D:
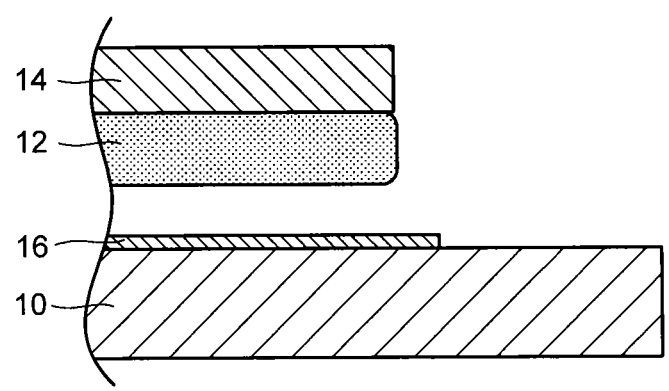

Steps after such a removing step, namely the steps in and after FIG. 5C are similar to those in and after FIG. 1C in the first embodiment, and thus their explanations are omitted.

In the second embodiment as well, the peripheral edge portion of the semiconductor wafer 14 is physically removed by the blade 30 in a manner that at least the front surface of the adhesive layer 12 right under the peripheral edge portion of the semiconductor wafer 14 is exposed, the adhesive layer 12 is caused to remain between the peripheral edge portion of the supporting substrate 10 and the semiconductor wafer 14, and the adhesion between the supporting substrate 10 and the semiconductor wafer 14 is maintained, and then the adhesive layer interposed between the supporting substrate 10 and the semiconductor wafer 14 is dissolved, so that it is possible to separate the adhesive layer 12 between the semiconductor wafer 14 and the supporting substrate 10 of the bonded substrate 20 for a short period of time without breaking both the supporting substrate 10 and the semiconductor wafer 14.

Particularly, in this embodiment, the peripheral edge portion of the semiconductor wafer 14 is removed to the position corresponding to the inside of the release layer 16, so that as compared with the first embodiment, it is possible to further reduce the time for dissolving the adhesive and to separate the supporting substrate 10 and the semiconductor wafer 14 for a shorter period of time. According to an experiment actually conducted by the present inventors, in the case when the thickness of the adhesive layer 12 was 30 μm, the distance from the outer edge of the adhesive layer 12 to the outer edge of the release layer 16 was 3 mm, and a distance ($W_2$) from the outer edge of the release layer 16 to the outer edge of the semiconductor wafer 14 was 0.5 mm, the adhesive layer 12 was brought into a dissolved state where the adhesive layer 12 is separable for only 10 to 15 minutes since the start of supply of the solvent. For the solvent, one similar to that used in the experiment in the first embodiment described previously was used, and was supplied by a similar method.

Further, it is possible to use the separated supporting substrate 10 again as a supporting substrate for a semiconductor wafer also in this embodiment. Further, in the removing step, the peripheral edge portion of the semiconductor wafer is removed by the blade 30 and an effect similar to that obtained when edge trimming is performed can be obtained, so that edge trimming on the semiconductor wafer in a different step can be omitted.

According to at least one embodiment described above, the peripheral edge portion of the semiconductor wafer on the release layer non-formation region, which is the region outside the release layer of the supporting substrate, is physically removed by the blade or the like in a manner that at least the front surface of the adhesive layer right under the peripheral edge portion of the semiconductor wafer is exposed, the adhesive layer is caused to remain between the peripheral edge portion of the supporting substrate and the semiconductor wafer, and the adhesion between the supporting substrate and the semiconductor wafer is maintained, and then the adhesive layer interposed between the supporting substrate and the semiconductor wafer is dissolved, so that it is possible to separate the semiconductor wafer and the supporting substrate from each other for a short period of time without breaking both the supporting substrate and the semiconductor wafer. Further, in the removing step, the peripheral edge portion of the semiconductor wafer is removed and an effect similar to that obtained when edge trimming is performed can be obtained, so that edge trimming on the semiconductor wafer in a different step can be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
   forming a release layer on a region excluding a peripheral edge portion of a surface of a first substrate;
   bonding a second substrate to at least a region including the release layer of the surface of the first substrate via an adhesive layer; and
   removing physically a peripheral edge portion of the second substrate in a manner that at least a surface of the adhesive layer right under the peripheral edge portion of the second substrate is exposed, the adhesive layer is caused to remain between the peripheral edge portion of the first substrate and the second substrate, and adhesion between the first and second substrates is maintained, and then dissolving the adhesive layer.

2. The method according to claim 1,
   wherein the peripheral edge portion of the second substrate is removed in a manner that an outer edge of the second substrate is positioned at an outer side from an outer edge of the release layer in plan view.

3. The method according to claim 2,
   wherein the peripheral edge portion of the second substrate is removed in a manner that a distance ($W_1$) between the outer edge of the second substrate and the outer edge of the release layer is 0.5 mm or more.

4. The method according to claim 3,
wherein a thickness of an adhesive layer is 20 μm or more.

5. The method according to claim 2,
wherein, the peripheral edge portion of the second substrate is removed in a manner that the adhesive right under the peripheral edge portion of the second substrate is removed substantially completely.

6. The method according to claim 2,
wherein, the peripheral edge portion of the second substrate is removed in a manner that only a side surface of the adhesive layer is exposed.

7. The method according to claim 1,
wherein, the peripheral edge portion of the second substrate is removed in a manner that an outer edge of the second substrate is positioned at an inner side from an outer edge of the release layer in plan view.

8. The method according to claim 7,
wherein the peripheral edge portion of the second substrate is removed in a manner that a distance ($W_2$) between the outer edge of the second substrate and the outer edge of the release layer is 0.5 mm or more.

9. The method according to claim 7,
wherein, the peripheral edge portion of the second substrate is removed in a manner that at least about half of a thickness of the adhesive right under the peripheral edge portion of the second substrate is caused to remain.

10. The method according to claim 1,
wherein a thickness of the adhesive layer is 5 to 100 μm.

11. The method according to claim 1,
wherein the second substrate is a semiconductor wafer.

12. The method according to claim 11,
wherein the semiconductor wafer has a circuit pattern on a surface facing the first substrate thereof.

13. The method according to claim 11,
wherein the semiconductor wafer is not edge-trimmed.

14. The method according to claim 1,
wherein the release layer is made of a non-releasable resin that does not exhibit adhesiveness to the adhesive layer.

15. The method according to claim 1,
wherein a distance (D) from an outer edge of the adhesive layer before the removal to an outer edge of the release layer is 1.0 to 4.0 mm.

16. The method according to claim 1,
wherein the dissolution is performed by supplying a solvent to dissolve the adhesive to a vicinity of an exposed surface of the adhesive layer.

17. The method according to claim 16,
wherein the solvent is supplied while rotating the bonded substrates.

18. The method according to claim 1,
wherein the adhesive is dissolvable in an organic solvent.

19. The method according to claim 1,
wherein the peripheral edge portion of the second substrate is removed by using a blade.

* * * * *